May 3, 1960

V. S. GITTENS ET AL

MOUNTING AND CONNECTING ARRANGEMENT FOR ELECTRICAL CIRCUIT ELEMENTS

Filed June 13, 1957

2,935,654

INVENTORS
VICTOR S. GITTENS
LOUIS BURKE

BY Albert H. Garland

ATTORNEY

United States Patent Office 2,935,654

Patented May 3, 1960

2,935,654

MOUNTING AND CONNECTING ARRANGEMENT FOR ELECTRICAL CIRCUIT ELEMENTS

Victor S. Gittens, Philadelphia, and Louis Burke, Perkasie, Pa., assignors to Philco Corporation, Philadelphia, Pa., a corporation of Pennsylvania Application June 13, 1957, Serial No. 665,504

2 Claims. (Cl. 317—101)

Figure 1:
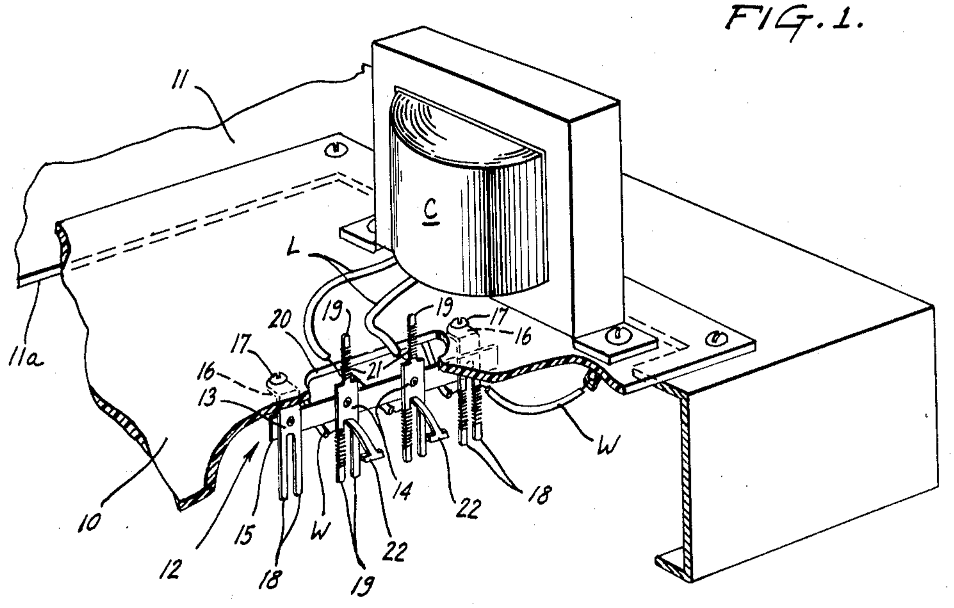

The invention herein described and claimed relates generally to electrical apparatus and pertains more particularly to a novel combination of wiring attachment means and panel means for interconnection of electrical devices. Specifically the invention has to do with terminal lug devices for establishing connections between electrical circuit elements of electronic equipment, such as television or radio receivers.

While of broader applicability, terminal lug devices constructed in accordance with the present invention are especially useful when employed in arrangements utilizing a non-conductive mounting base which has certain circuit elements supported on one of its sides, and other circuit elements disposed on the other of its sides. In arrangement of this kind, it is customary to affix terminal lug strips or panels on the more convenient side of the circuit mounting base and to effect connections between elements on said one side of the base with elements on the other side thereof by means of leads passing through said base and connected to terminal lugs of said strips. The manipulation of wires in passing and guiding them through the holes in the mounting base consumes production time and adds to production cost.

This cost has been reduced by recent adaptation of solderless type connections which bring about substantial savings in material and assembly time. In this type of connection, a lead or conductor wire is tightly wrapped about an elongated portion of a connecting lug by means of specially devised tools. To provide an adequate solderless connection, it is important that a lead or conductor wire be wrapped in a single layer and, in television and radio receivers of popular compact construction, it is desirable that the lug portion be comparatively short and narrow. It has been found that connection lug portions of suitable size will properly accommodate a single wire of comparatively small gauge so that certain types of components, such as capacitors and resistors provided with much heavier wire leads, cannot be wrapped properly to provide suitable solderless connections. For that reason, provision must still be made to solder components of that kind.

It is an important object of the invention to effect further reduction in manufacturing cost by providing a connection lug structure which makes it possible to interconnect components on opposite sides of a chassis or mounting base without the necessity of passing leads therethrough.

It is also an object of the invention to provide a compact unitary lug structure which combines connection legs for solderless as well as soldering attachment of leads thereto.

Other objects and advantageous features of the present invention reside in the provision of connection lug assemblies in which each lug has a plurality of connection legs to permit different types of electrical connection suited for various elements of an electronic circuit, in which the lugs are such that they can be mounted on a supporting strip or panel so as to be accessible from either side of a circuit mounting base, and in which the mounting lugs when assembled on their supporting strip or panel form a compact unit occupying little space on the chassis or circuit base.

To the above mentioned general ends, the invention employs a connection lug arrangement having a plurality of attachment portions. According to a broader aspect of the invention, certain of said portions are adapted to extend beyond one side of a circuit base or chassis to provide for connection with circuit elements on said one side, and certain other of said portions are adapted to extend beyond the other side of the base or chassis to provide for connection of circuit elements on said other side. In a more limited sense, the invention utilizes a conductive lug the opposite end portions of which are provided with longitudinally extended fingers adapted to afford electrical interconnection of circuit elements on opposite sides of the circuit mounting base. According to a preferred embodiment, a non-conductive strip serves to mount a number of lugs having the characteristic features of the invention, one or more of these lugs being provided with means for mounting the strip on the circuit base of chassis.

Figures 2, 3:
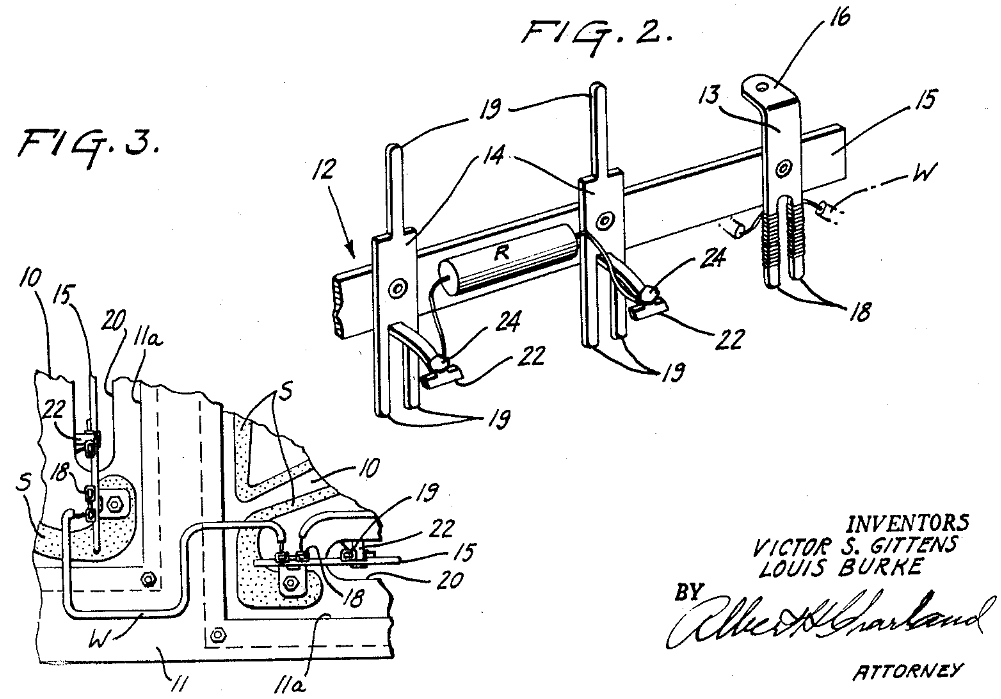

The full nature of the invention and the manner in which the hereinbefore mentioned objects and advantageous features of the invention are attained, will be more fully understood from the following description taken in conjunction with the accompanying drawing in which:

Figure 1 is a perspective view of a portion of a circuit mounting base provided with an attaching lug assembly embodying the invention and illustrates solderless connections of circuit elements to part of said assembly;

Figure 2 is an enlarged fragmentary view in perspective of a portion of the lug assembly shown in Figure 1, and illustrates leads of a component soldered to parts of said assembly and also certain leads secured by the solderless technique; and Figure 3 is a fragmentary bottom view of a chassis supporting a plurality of printed-wiring boards which are electrically interconnected by means of terminal lug devices constructed in accordance with the invention.

Having more particular reference to the drawing, there is illustrated in Figure 1, a circuit mounting base 10 which, as shown, is a board of non-conductive material, for instance phenolic plastic or synthetic resin. This base is supported on a metal chassis 11 provided with an open area **11*a* over which said base fits. In practice and as seen in Figure 3 several bases 10 can be mounted on the chassis 11, and each base 10 conveniently forms the support for conductive foil strips S to provide well known and so-called "printing wiring" circuits. In the illustrated example, each base 10** serves to support various circuit elements and, as seen in Figure 1, a coil C is mounted on the top side of the base and conductors W are arranged on the bottom side of said base.

In particular accordance with this invention, connection between these elements is accomplished by means of a lug assembly 12 including sets of conductive lugs 13 and 14, which are riveted or otherwise securely affixed to a panel or strip 15 of non-conductive material.

The lugs 13 are provided with an angularly bent foot 16 for mounting the strip in appropriate position on the base 10, for instance by means of a fastener 17 passing through the base and through said foot. These lugs 13 are advantageously provided with fingers 18 for attachment of circuit elements. As shown in Figure 1, the fingers 18 of one of the lugs 13 are employed to effect connections between leads on the underside of the circuit board or base 10. In Figure 3, the fingers 18 serve to establish electrical connections between the several circuit boards mounted on a chassis.

As hereinbefore indicated, the lugs 14 are adapted to provide for interconnection of circuit elements disposed on opposite sides of the base 10. For that purpose, both ends of these lugs 14 terminate with longitudinally extending fingers 19. Thus when the strip 15 is mounted on one side of the base and adjacent an opening 20 therein, certain of the fingers 19 are accessible from said one side whereas certain other of said fingers pass through said opening 21 and are accessible from the other side of said base. In the illustrated form, two fingers are provided at one end of each of the lugs 14 and one finger is provided at the other end of each of said lugs, and the strip 15 is mounted on the bottom side of the base 10, so that said two fingers of each lug project below said bottom side whereas said one finger of each lug passes through the mentioned opening and extend above the top side of the base.

In the arrangement shown in Figure 1, the leads L of the coil C on the top side of the base can be readily attached directly to the fingers above said base, and the conductors W on the underside of the base can be readily attached directly to the fingers below said base. Attachment of these leads and conductors to the lug fingers is conveniently accomplished by tightly wrapping the terminal portions of said leads and conductors to provide solderless connections 21.

In certain circuit design, and as seen in Figure 2, it is desirable to connect components, such as a resistor R, between certain of the lugs 14. For that purpose, each of these lugs are provided with a tab 22, which is conveniently formed by offsetting a portion of the lug body between the pair of fingers 19 at one end thereof. The offset tabs are such that the leads of the resistor R or similar component can be soldered, as represented at 24, to said tabs.

Although the invention has been shown and described with reference to a specific embodiment, it will be apparent that this embodiment is susceptible of variations without departing from the gist of the invention. For instance, the two mounting lugs which are shown at the opposite end portions of the mounting strip, could be located anywhere along the length of said strip and, if desired, a single mounting lug or more than two such lugs could be used on the strip. Also it will be apparent that the number and projected direction of the connecting fingers could be changed to suit requirements, and that the connection lug assembly could be used with a conventional chassis. Accordingly, it is to be understood that the invention is not limited to the specific arrangement herein shown and described but contemplates those modifications which come within the scope of the sub-joined claims.

What we claim is:

1. In combination with a flat base having circuit elements on both of its sides and provided with an elongated opening therethrough, a connection lug arrangement comprising a strip of non-conductive material and a series of conductive lugs including a pair of end lugs and a plurality of intermediate lugs, said strip having extended end portions to overlap portions of said base adjacent the opposite ends of said opening, said end lugs being attached to said extended end portions and having means to anchor said strip to said portions of said base and in registry with said opening, said intermediate lugs being attached to said strip between said end portions thereof and between said end lugs thereon, one end portion of each of said intermediate lugs having terminal means extending through said opening for connection with circuit elements on the corresponding side of said base, and the other end portion of each of said intermediate lugs having terminal means located at the opposite side of said base for connection with circuit elements on said opposite side.

2. In electronic apparatus, a metal chassis provided with an open area, a circuit mounting base of non-conductive material overlying said chassis and having an opening disposed within the confines of said open area, circuit paths disposed on the under side of said base, electrical components supported on the upper side of said base, a connection lug arrangement including a non-conductive strip and a series of conductive lugs secured thereto, two of said lugs being disposed one at one end of said strip and the other at the other end of said strip, each of said two lugs having a portion for connecting said strip to said base beneath and in registry with said opening therein, the remainder of said lugs occupying the intermediate portion of said strip and being disposed to pass through said opening in said base for electrical connection with said paths and components.

References Cited in the file of this patent

UNITED STATES PATENTS

| | | |
|---|---|---|
| 1,514,618 | Ide | Nov. 11, 1924 |
| 2,019,625 | O'Brien | Nov. 5, 1935 |
| 2,196,147 | Dunn | Apr. 2, 1940 |
| 2,226,745 | Schrack | Dec. 31, 1940 |
| 2,314,225 | Leece | Mar. 16, 1943 |
| 2,634,310 | Eisler | Apr. 7, 1953 |
| 2,823,371 | Jones | Feb. 11, 1958 |

FOREIGN PATENTS

| | | |
|---|---|---|
| 592,686 | Great Britain | Sept. 25, 1947 |